(12) United States Patent
Liu et al.

(10) Patent No.: US 7,304,351 B2
(45) Date of Patent: Dec. 4, 2007

(54) ACTIVE MATRIX SUBSTRATE (75) Inventors: Po-Yuan Liu, Hsinchu (TW); Shu-Ming Huang, Miaoli County (TW); Chao-Liang Lu, Taoyuan County (TW)

(73) Assignee: Au Optronics Corporation, Hsinchu (TW)

( * ) Notice: Subject to any disclaimer, the term of this patent is extended or adjusted under 35 U.S.C. 154(b) by 117 days.

(21) Appl. No.: 11/162,649

(22) Filed: Sep. 18, 2005

(65) Prior Publication Data

US 2006/0278929 A1 Dec. 14, 2006

(30) Foreign Application Priority Data

Jun. 13, 2005 (TW) ............................... 94119461 A (51) Int. Cl.
*H01L 23/62* (2006.01)
(52) U.S. Cl. ................ 257/355; 257/360; 257/E33.064
(58) Field of Classification Search ................ 257/360, 257/355, E33.064
See application file for complete search history.

(56) References Cited

U.S. PATENT DOCUMENTS

| | | | |
|---|---|---|---|
| 5,019,002 A * | 5/1991 | Holmberg .................... 445/24 |
| 5,373,377 A | 12/1994 | Ogawa et al. ................ 349/40 |
| 6,081,307 A | 6/2000 | Ha ............................... 349/40 |
| 6,175,394 B1 | 1/2001 | Wu et al. ...................... 349/40 |
| 6,535,261 B1 | 3/2003 | Anno et al. ................. 349/147 |
| 6,570,630 B2 | 5/2003 | Nakajima et al. ............. 349/40 |
| 6,765,630 B2 | 7/2004 | Nakajima et al. ............. 349/40 |

FOREIGN PATENT DOCUMENTS

| TW | 085112581 | 6/2001 |
|---|---|---|
| TW | 088102714 | 11/2001 |
| TW | 088120179 | 11/2003 |
| TW | 091116536 | 6/2004 |
| TW | 1998087104022 | 11/2004 |

* cited by examiner

*Primary Examiner*—Phat X. Cao
(74) *Attorney, Agent, or Firm*—Jianq Chyun IP Office (57) ABSTRACT

An active matrix substrate is provided, including a substrate, a plurality of pixel units, a static releasing conductive line and an ESD protection circuit, wherein the substrate has an active area and a peripheral area adjacent to each other. The pixel units are arranged in the active area in an array, and the static releasing conductive line is disposed in the peripheral area of the substrate. The ESD protection circuit is also disposed in the peripheral area of the substrate, being electrically connected between the pixel units and the static releasing conductive line. The ESD protection circuit includes a protection ring and a static consumption device, wherein the protection ring is disposed in a peripheral area of the substrate and the static consumption device has a floating gate, the static consumption device being electrically connected between the ESD protection circuit and the static releasing conductive line.

12 Claims, 6 Drawing Sheets

ACTIVE MATRIX SUBSTRATE

CROSS-REFERENCE TO RELATED APPLICATION

This application claims the priority benefit of Taiwan application serial no. 94119461, filed on Jun. 13, 2005. All disclosure of the Taiwan application is incorporated herein by reference.

BACKGROUND OF THE INVENTION

1. Field of the Invention

The present invention relates to a liquid crystal display (LCD), and particularly to an active matrix substrate having an electronic static discharge (ESD) protection circuit.

2. Description of Related Art

During a manufacturing process of an LCD, such as film deposition or dry etching in array process, alignment film rubbing in cell process, or the electric test on a substrate when the process ended, could inevitably lead to accumulation of static charges on the substrate. In details, the plasma used in the process of film deposition or dry etching may cause accumulation of static charges; rubbing during the alignment film fabrication process may cause accumulation of static charges; and electrical test on the substrate may also cause residue of charges. Because the material of the substrate is insulating transparent glass, the accumulated static charges on the substrate generated during the manufacturing process can not be easily conducted out of the substrate. When accumulated to a certain degree, the static charges may discharge at the substrate, and the static discharge may cause serious damage to the active matrix substrate.

Therefore, many methods for avoiding an active matrix substrate from being damaged by static discharge are developed accordingly. A conventional method is to design an ESD protection circuit for protecting the internal circuits of the active matrix substrate.

Figure 1:
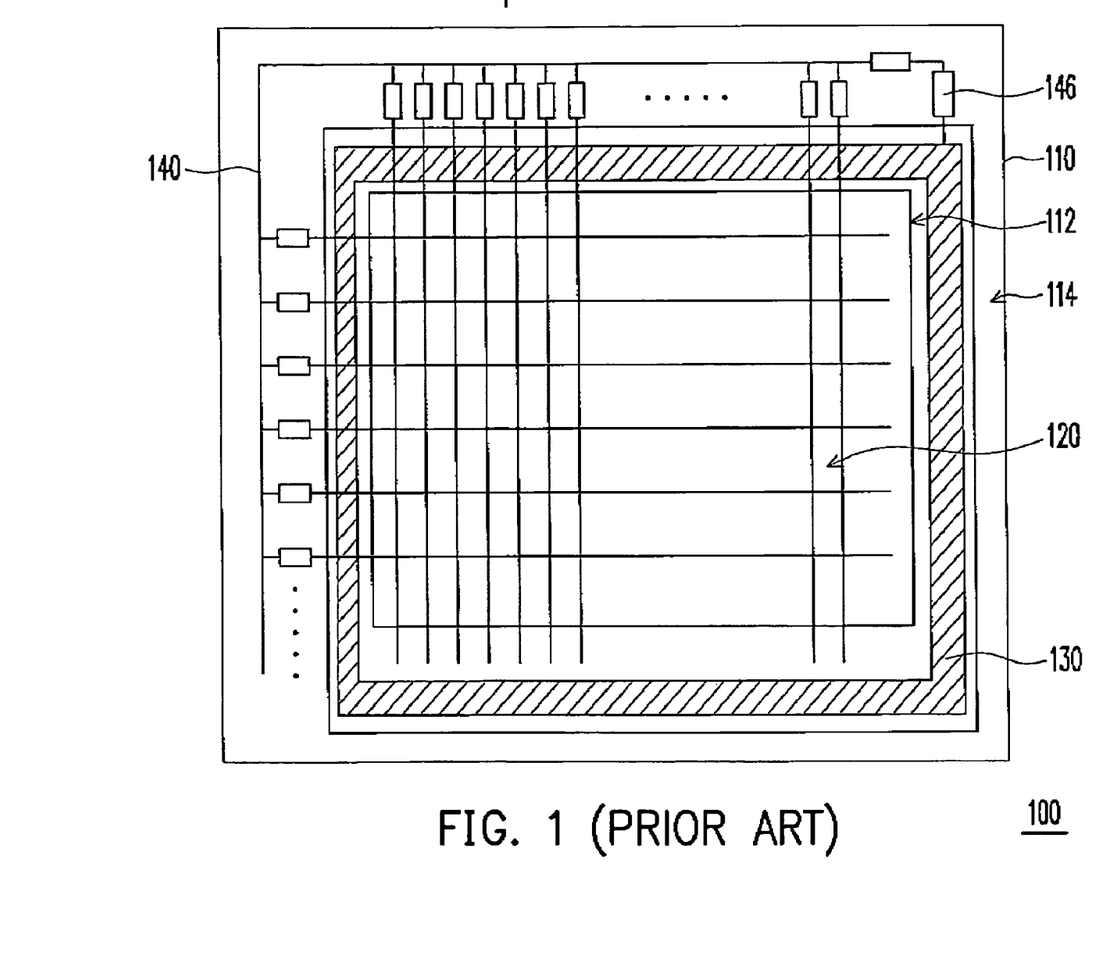
FIG. 1 is a schematic diagram of a conventional active matrix substrate.
Figure 2:
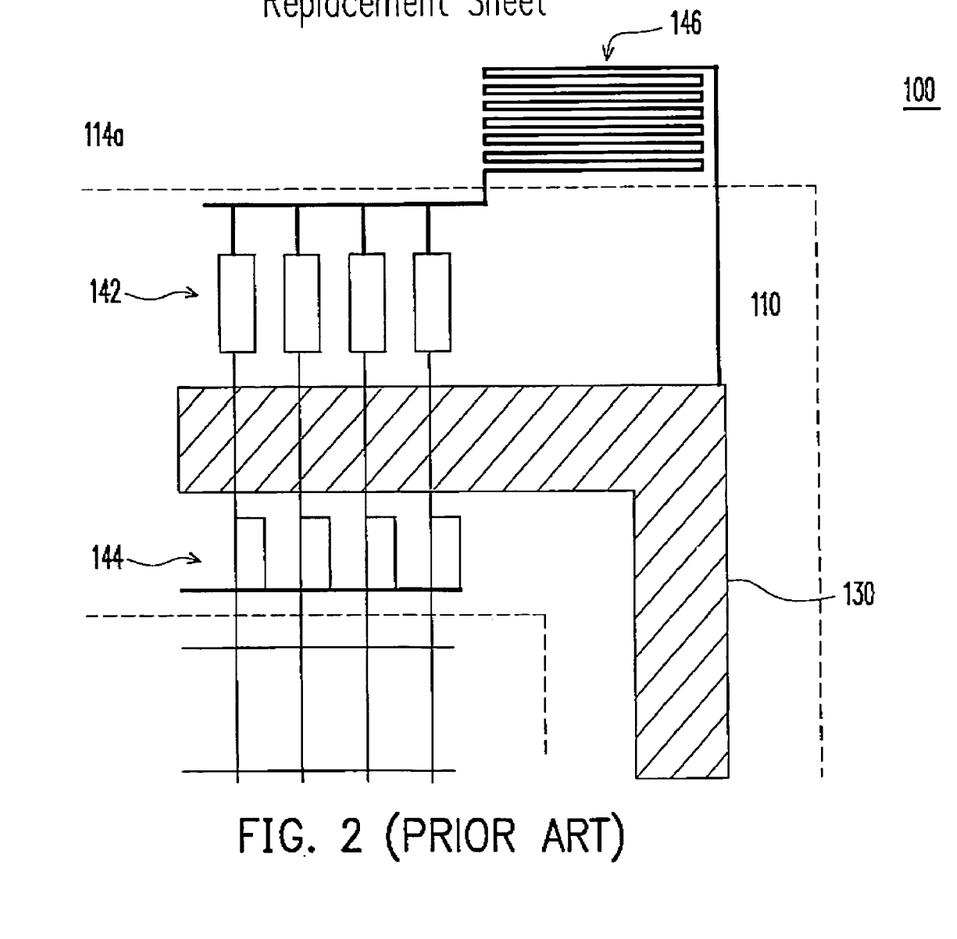
FIG. 2 is a partial enlarged diagram of FIG. 1.

FIG. 1 is a schematic diagram for illustrating a conventional active matrix substrate 100. FIG. 2 is a partial enlarged diagram of FIG. 1. Referring to FIGS. 1 and 2, on a substrate 110, a plurality of pixel units 120 arranged on an active area 112 in an array, a static releasing conductive line 130 and an ESD protection circuit 140 on a peripheral area 114 adjacent to the active area 112 are disposed. The ESD protection circuit 140 includes an outer short ring (OSR) 142, an inner short ring (ISR) 144 and a high-resistance consumption resistor 146 formed by a sinuous circuit. In details, the OSR 142 and ISR 144 are respectively composed of a plurality of parallel diodes, thin film transistors (TFT), capacitively coupled field effect transistors (CCFET) or a combination thereof. The OSR 142 and the high-resistance consumption resistor 146 are connected in series for forming an ESD protection circuit 140. Therefore, when static discharge occurs at the active matrix substrate 100, the ESD protection circuit 140 can protect the internal active device from being damaged.

Generally, in a manufacturing process of an active matrix substrate 100, a first metal layer of an active device and a scan line are formed by a first photolithography/etch process, a channel layer is formed by a second photolithography/etch process, a second metal layer of an active device and a data line are formed by a third photolithography/etch process, a through hole is formed by a fourth photolithography/etch process, and a pixel electrode is formed by a fifth photolithography/etch process. When the pixel electrode is formed by a fifth photolithography/etch process, the high-resistance consumption resistor 146 of the conventional ESD protection circuit 140 is fabricated simultaneously. Specifically, the high-resistance consumption resistor 146 including a sinuous trace with high resistance formed on a first cutting area 114a of the substrate 110, and the material of the trace is same as the material of the pixel electrode, such as indium tin oxide (ITO) indium zinc oxide (IZO) and so on. However, a time gap exists between forming the data line of the active matrix substrate 100 and forming the high-resistance consumption resistor 146, during which the ESD protection circuit 140 is not yet formed and can not protect the active matrix substrate 100. But the abnormal static discharge may occur to damage the active device of the active matrix substrate 100 after forming data line.

Referring to FIG. 2, a conventional ESD protection circuit 140 is usually disposed in a peripheral area 114. However, according to the process of the active matrix substrate 100, a plurality of cutting and edge grinding steps must be performed on the substrate 110 before the subsequent module assembly process. When the substrate 110 is cut at the second time, the high-resistance consumption resistor 146 located at the first cutting area 114a and a part of the ESD protection circuit 140 are cut away, therefore the ESD protection circuit can no longer protect the active matrix substrate 100. Unfortunately, static discharge may still occur during the following steps such as polarizer attachment, autoclave with pressuring or rework, therefore the active matrix substrate 100 without the protection of the ESD protection circuit 140 is still relatively vulnerable to the static discharge.

Figure 3:
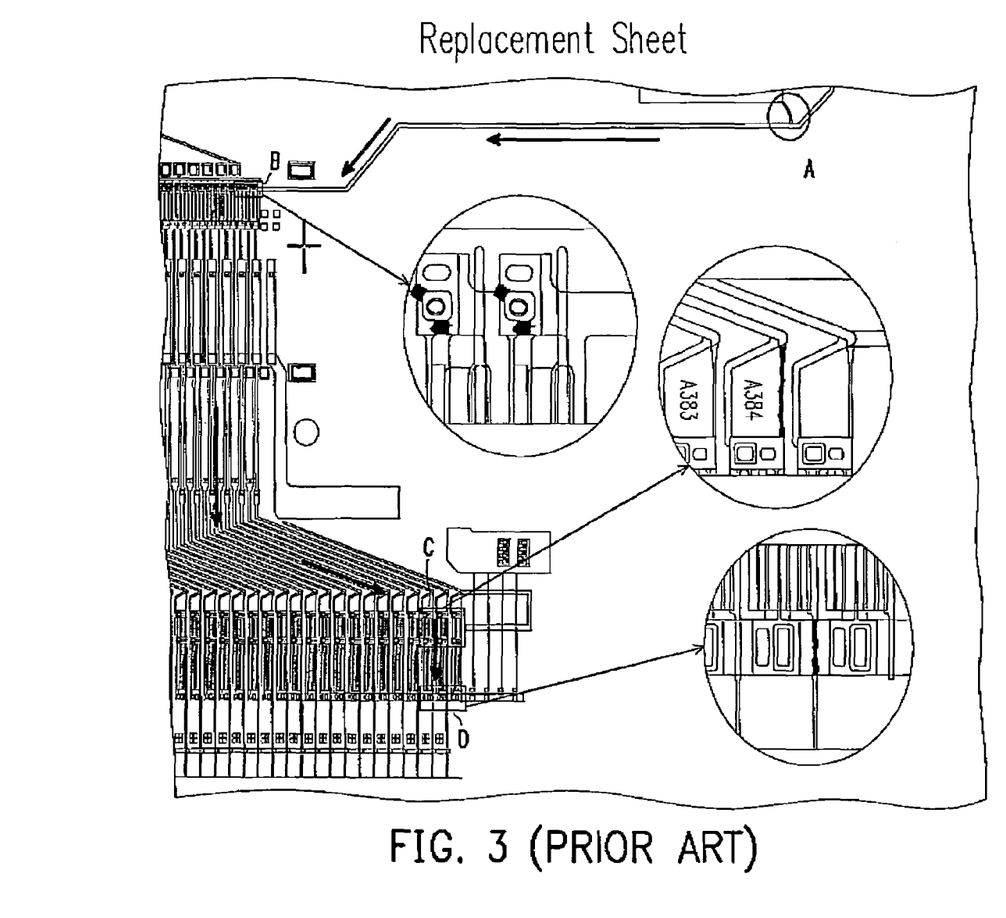
FIG. 3 is a schematic diagram of a conventional active matrix substrate being damaged due to static discharge.

FIG. 3 is a schematic diagram of a conventional active matrix substrate being damaged due to static discharge. Referring to FIG. 3, when an ESD occurs at "A" in an active matrix substrate 100, an OSR 142 of an ESD protection circuit 140 provides a first protection, and an ISR 144 of the ESD protection circuit 140 provides a second protection. Because the conventional ESD protection circuit 140 can not provide complete protection, the internal circuits of the active matrix substrate 100 such the data line at "D" are relatively vulnerable and therefore the display quality is affected accordingly.

SUMMARY OF THE INVENTION

The present invention is directed to provide an active matrix substrate having an ESD protection circuit for protecting the active matrix substrate from being damaged due to static discharge in the manufacturing process and therefore improving the yield of the active matrix substrate.

The present invention provides an active matrix substrate including a substrate, a plurality of pixel units, a static releasing conductive line and an ESD protection circuit, wherein the substrate has an active area and a peripheral area adjacent to the active area. The pixel units are arranged in the active area in an array, and the static releasing conductive line is disposed in the peripheral area of the substrate. The ESD protection circuit is disposed in the peripheral area of the substrate and electrically connected between the pixel units and the static releasing conductive line. The ESD protection circuit includes a protection ring and a static consumption device, wherein the protection ring is disposed in a peripheral area of the substrate and the static consumption device has a floating gate. In addition, the static consuming device is electrically connected between the ESD protection circuit and the static releasing conductive line.

According to an embodiment of the invention, a pixel unit includes a plurality of scan lines, a plurality of data lines, a plurality of active devices and a plurality of pixel electrodes, wherein the active devices are respectively electrically connected with the corresponding scan lines and data lines, and the pixel electrodes are respectively electrically connected with the corresponding active devices.

According to an embodiment of the invention, a protection ring includes an OSR and an ISR. The OSR includes a first conductive line and a plurality of first protection device, wherein the first protection device is electrically connected with the static consumption device via the first conductive line, the first protection device is composed of diodes, TFTs or a combination thereof. Furthermore, the ISR is disposed between the pixel units and the OSR. The ISR includes a second conductive line and a plurality of second protection device, wherein the second protection device is electrically connected with the static consumption device via the second conductive line, the second protection device is composed of diodes, TFTs or a combination thereof.

According to an embodiment of the invention, the foregoing static consumption device is electrically connected with the ISR and the OSR. According to an alternative embodiment of the invention, the foregoing static consumption device is electrically connected with the ISR or the OSR. Moreover, the static consumption device may be a TFT, a diode, a capacitor or a combination thereof, the resistance of the static consumption device is less than the resistance of the first protection device or the second protection device.

According to an embodiment of the invention, the static consumption device having a floating gate includes a first metal layer, an insulating layer, a semiconductive layer and a second metal layer. The insulating layer is disposed substantially over the first metal layer, the semiconductive layer is disposed substantially over the insulating layer, and the second metal layer is disposed substantially over the semiconductive layer.

The ESD protection circuit according to the present invention adopts a static consumption device having a floating gate, wherein the resistance of the static consumption device is less than the resistance of the first protection device or the second protection device. Therefore, the ESD protection circuit can protect the active devices and circuit in the active matrix substrate from being damaged due to static discharge. Thus, the yield of the active matrix substrate is improved significantly.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 4:
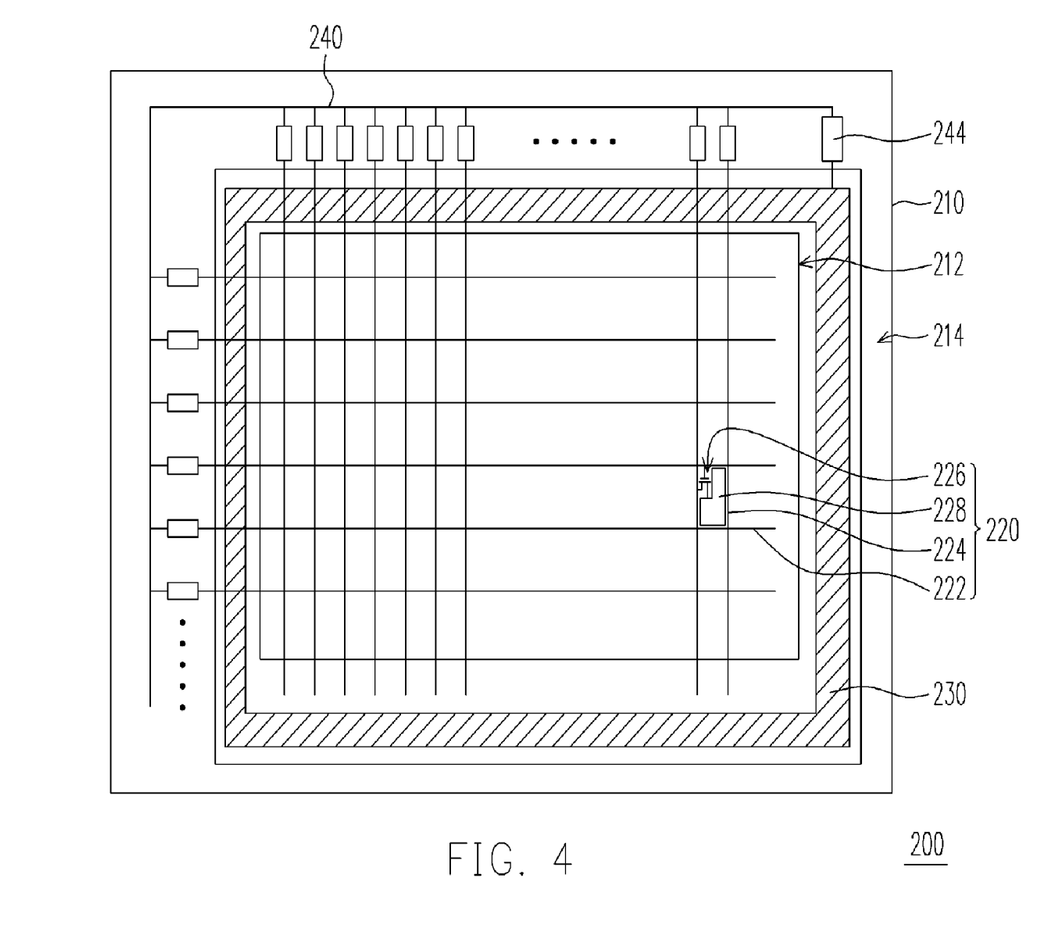
FIG. 4 is a schematic diagram of an active matrix substrate according to an embodiment of the present invention.

FIG. 4 is a schematic diagram of an active matrix substrate according to an embodiment of the present invention. Referring to FIG. 4, an active matrix substrate 200 includes a substrate 210, a plurality of pixel units 220, a static releasing conductive line 230 and an ESD protection circuit 240. The substrate 210 includes an active area 212 and a peripheral area 214 adjacent to the active area 212. The pixel units 220 are arranged on substrate 210 in an array. The pixel units 220 include a plurality of scan lines 222, a plurality of data lines 224, a plurality of active devices 226 and a plurality of pixel electrodes 228. In each of the pixel units 220, an active device 226 is electrically connected with the corresponding scan lines 222 and data lines 224, and the pixel electrode 228 is electrically connected with the active device 226. According to an embodiment of the invention, the material of the substrate 210 for example is glass, quartz or other similar materials; the material of the scan lines 222 and the data lines 224 may be metal with excellent electric conductivity; the material of the pixel electrodes 228 may be ITO, IZO or other transparent conductive material; and the active devices 226 may be TFTs or other tri-polar active devices.

Furthermore, the static releasing conductive line 230 is disposed in a peripheral area 214 of the substrate 210, and the material of the static releasing conductive line 230 may be metal with excellent electric conductivity. Further, the ESD protection circuit 240 is disposed in the peripheral area 214 and electrically connected between the pixel units 220 and the static releasing conductive line 230. The ESD protection circuit 240 includes a protection ring 242 (referring to FIG. 6) disposed in the peripheral area 214 and a static consumption device 244, wherein the protection ring 242 may include an OSR 242a (referring to FIG. 6) and an ISR 242b (referring to FIG. 6) disposed between the pixel units 220 and the OSR 242a according to their locations. The static consumption device 244 has a floating gate 250 (referring to FIG. 5) is electrically connected between the ESD protection circuit 240 and the static releasing conductive line 230.

Figure 5:
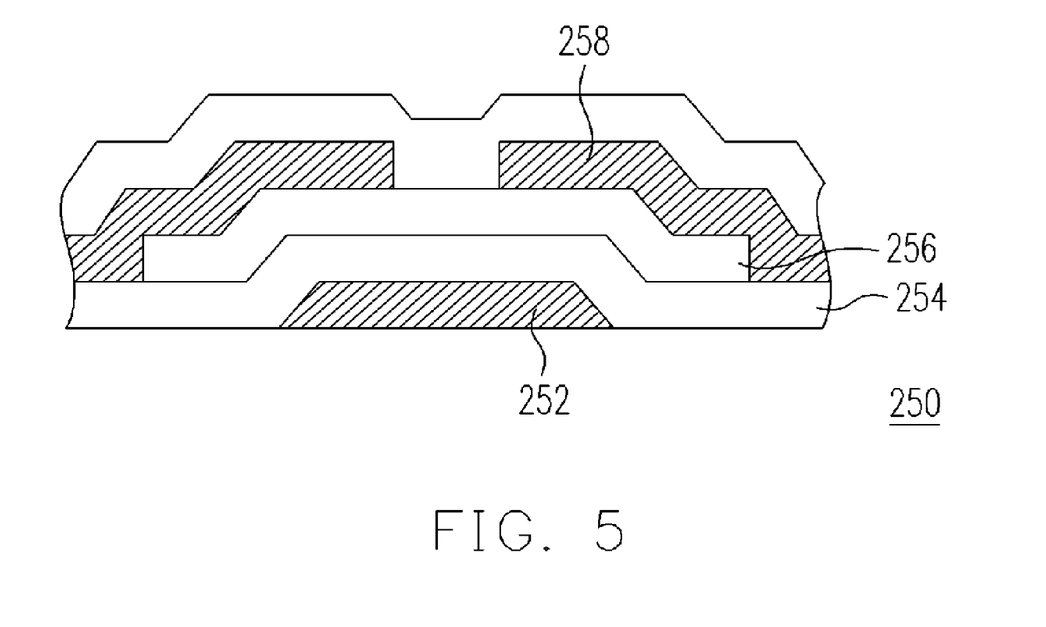
FIG. 5 is a schematic diagram of the static consumption device having a floating gate.

FIG. 5 is a schematic diagram of a static consumption device having a floating gate. Referring to FIG. 5, the floating gate 250 in the static consumption device 244 is adapted for consuming static charges. The floating gate 250 includes a first metal layer (floating gate electrode) 252, an insulating layer 254, a semiconductive layer (channel) 256 and a second metal layer (source/drain electrode) 258, wherein the insulating layer 254 is disposed substantially over the first metal layer (floating gate electrode) 252, the semiconductive layer 256 is disposed substantially over the insulating layer 254, and the second metal layer 258 is disposed substantially over the semiconductive layer 256.

Figure 6:
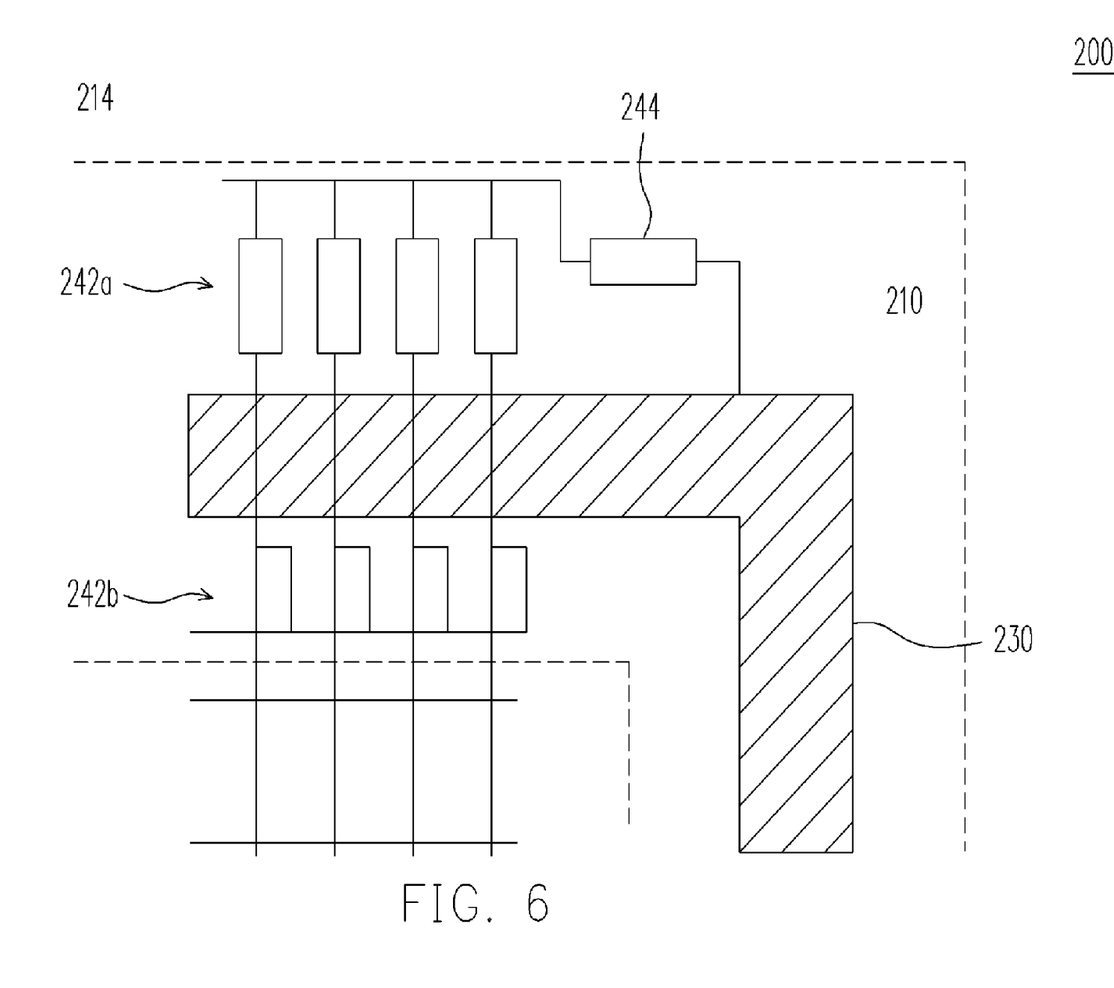
FIG. 6 is a schematic partial diagram of an active matrix substrate according to an embodiment of the present invention.

FIG. 6 is a schematic partial diagram of an active matrix substrate according to an embodiment of the present invention. Referring to FIG. 6, the OSR 242a in accordance with the embodiment includes a metal conductive line and a plurality of parallel connected protection device. The OSR 242a is electrically connected in series with the static consumption device 244. The ISR 242b also includes a metal conductive line and a plurality of parallel connected protection device. The ISR 242b is electrically connected with the static consumption device 244 via the OSR 242a.

According to another embodiment of the invention, the static consumption device 244 may be electrically connected with the OSR 242a or the ISR 242b. Therefore, the ESD protection circuit 240 (referring to FIG. 4) is adapted for protecting the pixel units 220 of the active matrix substrate 200 from being damaged when static discharge occurs. According to an alternative embodiment of the invention, the protection device of the OSR 242a and the ISR 242b may be diodes, TFTs, or a combination thereof. The protection device acts as a switch of a static charges releasing path in the ESD protection circuit 240. It should be noted that the resistance of the static consumption device 244 in the ESD protection circuit 240 may be less than the resistance of the OSR 242a or the resistance of the ISR 242b.

Referring to the FIGS. 4 and 6, during a dry etching process, rubbing process of alignment film or other processes for manufacturing the active matrix substrate 200, a static discharging may occur at the active matrix substrate 200. In order to protect the pixel units 220 in the active area 212 from being damaged due to the static discharging, when such static discharging occur, the ESD protection circuit 240 will protect the active matrix substrate 200 from being damaged via an OSR 242a, an ISR 242b and a static consumption device 244 having at least a floating gate.

Note that the static consumption device 244 is formed simultaneously with the data line 224. In details, in the manufacturing process of the active matrix substrate 200, when the data line 224 is fabricated by the third photolithography/etch process, the static consumption device 244 is simultaneously fabricated. Therefore, the static consumption device 244 is completed after the third photolithography/etch process is performed. In other words, the ESD protection circuit is able to protect the active matrix substrate 200 and avoid the active devices 226, the data line 224 and the scan line 222 from being damaged due to such static discharge. Therefore, the ESD protection circuit 240 formed by the third photolithography/etch process can protect the active matrix substrate 200 effectively.

Moreover, the static consumption device 244 is designed to occupy a relatively small area, and can be disposed closely adjacent to the OSR 242a. After the cutting process and the edge grinding process of the active matrix substrate 200, the ESD protection circuit 240 is still located on the active matrix substrate 200, instead of being cut away. Accordingly, during the cutting process and the edge grinding process of the active matrix substrate 200, such an ESD protection circuit 240 is also able to protect the active matrix substrate 200 from being damaged due to static discharge.

In summary, the present invention has at least the advantages as below:

The ESD protection circuit has a floating gate, and the resistance of the static consumption device is less than the resistance of the first protection device or the second protection device, such that the ESD protection circuit can substantially consume and release static charges for protecting the active matrix substrate.

The static consumption device is formed by the third photolithography/etch process, therefore the ESD protection circuit is able to protect the active matrix substrate from being damaged due to static discharge.

The static consumption device is disposed adjacent to the OSR for avoiding the static consumption device from being cut away and thereby making the ESD protection circuit invalid after cutting and edge grinding processes are performed on the active device array. The ESD protection circuit of the present invention is able to protect the active matrix substrate from being damaged due to static discharge after the third photolithography/etch process is performed and thus improving the yield of the active matrix substrates.

Other modifications and adaptations of the above-described preferred embodiments of the present invention may be made to meet particular requirements. This disclosure is intended to exemplify the invention without limiting its scope. All modifications that incorporate the invention disclosed in the preferred embodiment are to be construed as coming within the scope of the appended claims or the range of equivalents to which the claims are entitled.

What is claimed is:

1. An active matrix substrate, comprising:
    a substrate comprising an active area and a peripheral area, the active area and the peripheral area being adjacent to each other;
    a plurality of pixel units arranged in the active area in an array;
    a static releasing conductive line disposed in the peripheral area of the substrate; and
    an ESD protection circuit disposed in the peripheral area of the substrate, and electrically connected between the pixel units and the static releasing conductive line, wherein the ESD protection circuit comprises:
        a protection ring disposed in a peripheral area of the substrate, wherein the protection ring comprises an outer short ring and an inner short ring disposed between the pixel units and the outer short ring; and
        a static consumption device having at least one floating gate, wherein the static consumption device is electrically connected between the outer short ring and the static releasing conductive line, and the static consumption device is disposed adjacent to the outer short ring.

2. The active matrix substrate according to claim 1, wherein the pixel units comprise:
    a plurality of scan lines;
    a plurality of data lines;
    a plurality of active devices electrically connected with the corresponding scan lines and data lines respectively; and
    a plurality of pixel electrodes electrically connected with the corresponding active devices respectively.

3. The active matrix substrate according to claim 1, wherein the static consumption device is electrically connected with the outer short ring and the inner short ring.

4. The active matrix substrate according to claim 1, wherein the static consumption device is electrically connected with the outer short ring or the inner short ring.

5. The active matrix substrate according to claim 1, wherein the outer short ring comprises:
    a first conductive line; and
    a plurality of first protection device electrically connected with the static consumption device via the first conductive line.

6. The active matrix substrate according to claim 5, wherein the first protection device comprises diodes, TFTs or a combination thereof.

7. The active matrix substrate according to claim 5, wherein the resistance of the static consumption device is less than the resistance of a first protection device.

8. The active matrix substrate according to claim 1, wherein the inner short ring comprises:
    a second conductive line; and
    a plurality of second protection device electrically connected with the static consumption device via the second conductive line.

9. The active matrix substrate according to claim 8, wherein the second protection device comprises diodes, TFTs or a combination thereof.

10. The active matrix substrate according to claim 8, wherein the resistance of the static consumption device is less than the resistance of a second protection device.

11. The active matrix substrate according to claim 1, wherein the static consumption device comprises TFTs, diodes, capacitors or a combination thereof.

12. The active matrix substrate according to claim 1, wherein the static consumption device comprises:

a first metal layer;

an insulating layer disposed substantially over the first metal layer;

a semiconductive layer disposed substantially over the insulating layer; and a second metal layer disposed substantially over the semiconductive layer.

\* \* \* \* \*